(12) United States Patent
Yang et al.

(10) Patent No.: US 10,852,380 B2
(45) Date of Patent: Dec. 1, 2020

(54) MAGNETIC RESONANCE IMAGE RECONSTRUCTION

(71) Applicant: Shanghai Neusoft Medical Technology Co., Ltd., Shanghai (CN)

(72) Inventors: Yongfa Yang, Shenyang (CN); Feng Huang, Shanghai (CN); Hongyu Guo, Shenyang (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 177 days.

(21) Appl. No.: 16/049,308

(22) Filed: Jul. 30, 2018

(65) Prior Publication Data
US 2019/0033417 A1    Jan. 31, 2019

(30) Foreign Application Priority Data

Jul. 31, 2017   (CN) ............................ 2017 1 0643372
Jul. 25, 2018   (CN) ............................ 2018 1 0829383

(51) Int. Cl.
*G01R 33/561*   (2006.01)
*G01R 33/56*    (2006.01)
(Continued)

(52) U.S. Cl.
CPC ........ *G01R 33/5611* (2013.01); *G01R 33/246* (2013.01); *G01R 33/5608* (2013.01); *G01R 33/5616* (2013.01); *G01R 33/5659* (2013.01)

(58) Field of Classification Search
CPC ............ G01R 33/5611; G01R 33/5659; G01R 33/246; G01R 33/5608; G01R 33/5616;
(Continued)

(56) References Cited

U.S. PATENT DOCUMENTS 8,717,024 B2 * 5/2014 King ................... G01R 33/5611
                                                    324/309
9,581,671 B2 * 2/2017 Dannels ........... G01R 33/56554
(Continued)

FOREIGN PATENT DOCUMENTS

CN        102521809 A    6/2012
CN        102959426 A    3/2013
(Continued)

OTHER PUBLICATIONS

Van den Brink, J.S., Watanabe, Y., Kuhl, C.K., Chung, T., Muthupillai, R., Van Cauteren, M., Yamada, K., Dymarkowski, S., Bogaert, J., Maki, J.H. and Matos, C., 2003. Implications of SENSE MR in routine clinical practice. European journal of radiology, 46(1), pp. 3-27. (Year: 2003).*

(Continued)

*Primary Examiner* — Christopher P McAndrew
(74) *Attorney, Agent, or Firm* — Fish & Richardson P.C.

(57) ABSTRACT

Methods, devices and apparatus for reconstructing a magnetic resonance image are provided. In one aspect, a method includes: determining array coil images according to first data collected by array coils of an MRI device during a prescan, where each coil of the array coils corresponds to a respective one of channels; determining a quadrature body coil image according to at least one of second data collected by a quadrature body coil of the MRI device during the prescan and the first data collected by the array coils; obtaining a corrected quadrature body coil image by correcting an uniformity of the quadrature body coil image; determining coil sensitivity maps according to the array coil images and the corrected quadrature body coil image; and reconstructing a magnetic resonance image with third data collected by the array coils during a normal scan according to the coil sensitivity maps.

16 Claims, 6 Drawing Sheets

---

Obtain the second data collected by the quadrature body coil by performing a prescan with a Fast Field Echo 3D sequence — S201

Determine the quadrature body coil image based on the second data — S202

(51) Int. Cl.
*G01R 33/565* (2006.01)
*G01R 33/24* (2006.01)

(58) Field of Classification Search
CPC .......... G06T 7/136; G06T 5/002; G06T 5/50; G06T 2207/10088
USPC ........................................................ 324/309
See application file for complete search history.

(56) References Cited

U.S. PATENT DOCUMENTS

| | | | |
|---|---|---|---|
| 2008/0007250 A1* | 1/2008 | Wiggins | G01R 33/34084 324/200 |
| 2009/0179643 A1* | 7/2009 | Lin | G01R 33/5611 324/312 |
| 2011/0044524 A1* | 2/2011 | Wang | G01R 33/54 382/131 |
| 2012/0002859 A1* | 1/2012 | Huang | G01R 33/5611 382/131 |
| 2013/0099786 A1* | 4/2013 | Huang | G01R 33/56 324/309 |
| 2013/0187651 A1* | 7/2013 | Konta | G01R 33/56383 324/309 |
| 2015/0323633 A1* | 11/2015 | Cauley | G01R 33/5608 324/309 |
| 2016/0104279 A1 | 4/2016 | Li et al. | |
| 2017/0030988 A1* | 2/2017 | Stehning | G01R 33/5608 |

FOREIGN PATENT DOCUMENTS

| | | |
|---|---|---|
| CN | 106574955 A | 4/2017 |
| WO | WO2015158625 A1 | 10/2015 |

OTHER PUBLICATIONS

Kuhara, S., Kassai, Y., Ishihara, Y., Yui, M., Hamamura, Y. and Sugimoto, H., Apr. 2000, A novel EPI reconstruction technique using multiple RF coil sensitivity maps. In Proc. 8th Scientific Meeting International Society of Magnetic Resonance Medicine (vol. 154). (Year: 2000).*
Hu, Z., etal. "MR-based attenuation correction for a whole-body sequential PET/MR system." 2009 IEEE Nuclear Science Symposium Conference Record (NSS/MIC). IEEE, 2009. (Year: 2009).*
Cheng H, Huang F. MRI Image Intensity Correction with Extrapolation and Adaptive Smoothing. Magnetic Resonance in Medicine 2006: 55: 959-966.
State Intellectual Property Office of the People's Republic of China, Office Action and Search Report Issued in Application No. 2018108293831, dated Jun. 1, 2020, 19 pages, (Submitted with Machine Translation).
Weng Zhuo, Chinese Master's Theses Full-text Database Information Science and Technology,"Study on Artifacts Reduction in SENSE Parallel MRI and Sparse Sampling Reconstructed Algorithm", Jul. 15, 2012, 76 pages.
Wyger M. Brink et al, Magnetic Resonance in Medicine, "Passive Radiofrequency Shimming in the Thighs at 3 Tesla Using High Permittivity Materials and Body Coil Receive Uniformity Correction", Dec. 31, 2016, 6 pages.
Johan S. van den Brink et al, European Journal of Radiology, "Implications of SENSE MR in routine clinical practice" Dec. 31, 2003, 25 pages.
S. Kuhara et al, In Proc.8th Scientific Meeting International Society of Magnetic Resonance Medicine, "A Novel EPI Reconstruction Technique using Multiple RF Coil Sensitivity Maps", Dec. 31, 2000, 1 pages.

* cited by examiner

MAGNETIC RESONANCE IMAGE RECONSTRUCTION

CROSS REFERENCE TO RELATED APPLICATIONS

This application claims priority to both Chinese Patent Application No. 201710643372.X filed on Jul. 31, 2017, and Chinese Patent Application No. 201810829383.1 filed on Jul. 25, 2018, the entire contents of which are incorporated herein by reference.

BACKGROUND

Magnetic Resonance Imaging (MRI) technology is physically based on a phenomenon of Nuclear Magnetic Resonance (NMR). Microstructure of a substance may be studied based on the NMR phenomenon. A biological tissue may be excited by different Radio Frequency Pulse (RFP) sequences so that the biological tissue can generate nuclear magnetic resonance signals. Then, spatial encoding may be performed for the magnetic resonance signals by using a linear gradient field. Image reconstruction may be performed for data received by a receiving coil based on characteristics such as relaxation time and proton density of a detected tissue, thereby forming a magnetic resonance image. The MRI has irreplaceable advantages in soft tissue imaging, nerve system imaging and cerebral function imaging, etc.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices and apparatus for magnetic resonance image construction, for example, by using a corrected quadrature body coil image with better uniformity in calculation of coil sensitivity maps, which can improve uniformities of the coil sensitivity maps and ultimately improve the quality of a reconstructed magnetic resonance image.

One aspect of the present disclosure features a method of reconstructing a magnetic resonance image, including: determining array coil images according to first data collected by a plurality of array coils of a Magnetic Resonance Imaging (MRI) device during a prescan, where each coil of the plurality of array coils corresponds to a respective channel of a plurality of channels; determining a quadrature body coil image according to at least one of second data collected by a quadrature body coil of the MRI device during the prescan and the first data collected by the array coils; obtaining a corrected quadrature body coil image by correcting a uniformity of the quadrature body coil image; determining coil sensitivity maps according to the array coil images and the corrected quadrature body coil image; and reconstructing a magnetic resonance image with third data collected by the array coils during a normal scan according to the coil sensitivity maps.

In some implementations, determining the quadrature body coil image includes: obtaining the second data collected by the quadrature body coil by performing the prescan with a Fast Field Echo 3D (three dimensional) sequence; and determining the quadrature body coil image based on the second data collected by the quadrature body coil. Determining coil sensitivity maps according to the array coil images and the corrected quadrature body coil image can include: for each of the plurality of channels, obtaining a respective coil sensitivity map by dividing a magnitude image of an array coil image corresponding to the channel by a magnitude image of the corrected quadrature body coil image.

In some implementations, determining the quadrature body coil image includes: obtaining the second data collected by the quadrature body coil and the first data collected by the array coils by performing the prescan with a Fast Field Echo 3D sequence; determining an array coil image for each of the plurality of channels according to the first data collected by the array coil corresponding to the channel, where the array coil image includes a first magnitude image and a first phase image; determining a quadrature body coil complex image according to the second data collected by the quadrature body coil, where the quadrature body coil complex image includes a second magnitude image and a second phase image; determining the magnitude image of the quadrature body coil image according to a square root of sum of squares of the first magnitude images for the plurality of channels; and obtaining a phase image of the quadrature body coil image according to the second phase image of the quadrature body coil complex image. Determining coil sensitivity maps according to the array coil images and the corrected quadrature body coil image can include: for each of the plurality of channels, obtaining a respective coil sensitivity map by dividing an array coil image corresponding to the channel by the corrected quadrature body coil image, where the obtained coil sensitivity map includes phase information associated with a first phase image of the corresponding array coil image and a phase image of the corrected quadrature body coil image, where the phase image of the corrected quadrature body coil image is the obtained phase image of the quadrature body coil image according to the second phase image.

In some implementations, determining the quadrature body coil image includes: obtaining the first data collected by the array coils before each normal imaging sequence by scanning a predetermined number of rows near a central region of k-space; determining a first magnitude image of an array coil image for each of the plurality of channels according to the first data corresponding to the channel; and determining a magnitude image of the quadrature body coil image according to a square root of sum of squares of the first magnitude images for the plurality of channels. Determining coil sensitivity maps according to the array coil images and the corrected quadrature body coil image can include: for each of the plurality of channels, obtaining a respective coil sensitivity map by dividing a first magnitude image of an array coil image corresponding to the channel by a magnitude image of the corrected quadrature body coil image, where the magnitude image of the corrected quadrature body coil image can be determined based on the magnitude image of the quadrature body coil image.

Correcting a uniformity of the quadrature body coil image can include correcting a magnitude image of the quadrature body coil image. In some implementations, correcting the magnitude image of the quadrature body coil image includes: obtaining a binary image representing a hole region and an image support region by performing threshold segmentation for the magnitude image of the quadrature body coil image; calculating gradients of the binary image to obtain a boundary of the image support region; extrapolating the image support region to the hole region according to the boundary of the image support region to obtain an extrapolated image; smoothing the extrapolated image to obtain a signal modulation image; dividing the magnitude image of the quadrature body coil image by the signal modulation image to generate a new image; and obtaining a magnitude image of the corrected quadrature body coil image by performing grayscale value restoration for the new image. In some cases, extrapolating the image support region to the hole region includes: keeping pixels in the image support region unchanged; and changing each pixel in the hole region into a specific pixel of the image support region determined by mirror reflection.

Another aspect of the present disclosure features a device for reconstructing a magnetic resonance image, including: at least one processor; and at least one non-transitory machine-readable storage medium coupled to the at least one processor having machine-executable instructions stored thereon that, when executed by the at least one processor, cause the at least one processor to perform operations including: determining array coil images according to first data collected by array coils of an MRI device during a prescan, where each coil of the array coils corresponds to a respective channel of channels; determining a quadrature body coil image according to at least one of second data collected by a quadrature body coil of the MRI device during the prescan and the first data collected by the array coils; obtaining a corrected quadrature body coil image by correcting a uniformity of the quadrature body coil image; determining coil sensitivity maps according to the array coil images and the corrected quadrature body coil image; and reconstructing a magnetic resonance image with third data collected by the array coils during a normal scan according to the coil sensitivity maps.

In some implementations, determining the quadrature body coil image includes: obtaining the second data collected by the quadrature body coil by performing the prescan with a Fast Field Echo 3D sequence; and determining the quadrature body coil image based on the second data collected by the quadrature body coil.

In some implementations, determining the quadrature body coil image includes: obtaining the second data collected by the quadrature body coil and the first data collected by the array coils by performing the prescan with a Fast Field Echo 3D sequence; determining an array coil image for each of the channels according to the first data collected by the array coil corresponding to the channel, where the array coil image includes a first magnitude image and a first phase image; determining a quadrature body coil complex image according to the second data collected by the quadrature body coil, where the quadrature body coil complex image includes a second magnitude image and a second phase image; determining a magnitude image of the quadrature body coil image according to a square root of sum of squares of the first magnitude images for the channels; and obtaining a phase image of the quadrature body coil image according to the second phase image of the quadrature body coil complex image.

In some implementations, determining the quadrature body coil image includes: obtaining the first data collected by the array coils before each normal imaging sequence by scanning a predetermined number of rows near the central region of k-space; determining a first magnitude image of an array coil image for each of channels according to the first data corresponding to the channel; and determining a magnitude image of the quadrature body coil image according to a square root of sum of squares of the first magnitude images for the channels.

Correcting a uniformity of the quadrature body coil image can include correcting a magnitude image of the quadrature body coil image. In some implementations, correcting the magnitude image of the quadrature body coil image includes: obtaining a binary image representing a hole region and an image support region by performing threshold segmentation for the magnitude image of the quadrature body coil image; obtaining a boundary of the image support region by calculating gradients of the binary image; obtaining an extrapolated image by extrapolating the image support region to the hole region according to the boundary of the image support region; obtaining a signal modulation image by smoothing the extrapolated image; obtaining a new image by dividing the magnitude image of the quadrature body coil image by the signal modulation image; and obtaining a magnitude image of the corrected quadrature body coil image by performing grayscale value restoration for the new image. In some cases, extrapolating the image support region to the hole region includes: keeping pixels in the image support region unchanged; and changing each pixel in the hole region into a specific pixel of the image support region determined by mirror reflection.

In some implementations, determining the coil sensitivity maps includes: for each of the channels, obtaining a respective coil sensitivity map by dividing a magnitude image of an array coil image corresponding to the channel by a magnitude image of the corrected quadrature body coil image. In some implementations, determining the coil sensitivity maps includes: for each of the channels, obtaining a respective coil sensitivity map by dividing an array coil image corresponding to the channel by the corrected quadrature body coil image.

A further aspect of the present disclosure features a non-transitory machine-readable storage medium coupled to at least one processor having machine-executable instructions stored thereon that, when executed by the at least one processor, cause the at least one processor to perform operations including: determining array coil images according to first data collected by array coils of an MRI device during a prescan, where each coil of the array coils corresponds to a respective channel of channels; determining a quadrature body coil image according to at least one of second data collected by a quadrature body coil of the MRI device during the prescan and the first data collected by the array coils; obtaining a corrected quadrature body coil image by correcting a uniformity of the quadrature body coil image; determining coil sensitivity maps according to the array coil images and the corrected quadrature body coil image; and reconstructing a magnetic resonance image with third data collected by the array coils during a normal scan according to the coil sensitivity maps.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

During reconstructing a magnetic resonance image, the image may be non-uniform due to non-uniformity problems of a main magnetic field, a radio frequency transmitting field or a radio frequency receiving field. Therefore, to obtain a uniform magnetic resonance image, it is required to correct the uniformity of the image.

At present, uniformity correction may be performed for an image by two methods as follows.

The first method is a post-processing method. In this method, a reconstructed image is firstly obtained which is non-uniform, and uniformity correction is then performed for the non-uniform image. This method has a problem that each image of each scan is required to perform this correction, thereby resulting in a large quantity of calculation and a slow imaging speed.

The second method is a reconstruction method. In this method, a same tissue is prescanned to obtain data from array coils and a Quadrature Body Coil (QBC) so as to respectively reconstruct array coil images and a quadrature body coil image. Then, coil sensitivity maps are obtained by dividing the array coil images by the quadrature body coil image. Data collected by the array coils during a normal imaging sequence may be reconstructed by the coil sensitivity maps to obtain a magnetic resonance image. The array coils may be a multi-channel array coil, and different array coils correspond to different regions of a human body. For example, a head of the human body may be scanned by using array coils corresponding to the head; an abdomen may be scanned by using array coils corresponding to the abdomen. The QBC is not only a transmitting coil, but also a receiving coil. Since a receiving magnetic field of the QBC is uniform and a transmitting magnetic field in low field strength is also uniform, a better image uniformity may be obtained finally. In addition, data representing tissue structures obtained by scanning with the array coils and the QBC are approximately the same and may be eliminated after division these data. For example, in a reconstruction method of SENSitivity Encoding (SENSE), coil sensitivity maps are calculated firstly by using the array coil images and the quadrature body coil image, and then data collected by the array coils during a normal imaging sequence may be reconstructed by using the coil sensitivity maps.

However, problems also exist in the reconstruction method. In the method, the quadrature body coil image is firstly assumed to be uniform, but this assumption is problematic in practice. For example, a) in a magnetic resonance imaging (MRI) system, a radio frequency transmitting field in high field strength may not be uniform; b) due to an imperfect hardware, a radio frequency receiving field may also be non-uniform; or c) a main magnetic field may also be non-uniform Therefore, when the quadrature body coil image as the divisor itself is non-uniform, the calculated coil sensitivity maps also may not be uniform enough, thereby failing to reconstruct a uniform image.

A method provided by an example of the present disclosure is used to solve the technical problem that coil sensitivity maps are still non-uniform when a magnetic resonance image is reconstructed by using the SENSE method. The technical problem will be briefly introduced below.

The formula (1) for calculating the coil sensitivity maps is as follows:

$$S_i = \frac{f_i}{Q}, \qquad (1)$$

where Q refers to a low-resolution quadrature body coil image, $f_i$ refers to a low-resolution array coil image of a channel i, and $S_i$ refers to a coil sensitivity map of the channel i, and i refers to a channel index of the array coils. It is noted that $S_i$ obtained herein is also a low-resolution coil sensitivity map, but coil sensitivity maps at full Field of View (FOV) of each channel can be generated by using existing technologies such as filtering, thresholding and point estimation. It may be understood that array coils included in an MRI device is a multi-channel array coil, and array coils of different channels correspond to different regions of a patient.

At present, for the coil sensitivity maps generated by the formula (1), the uniformity of Q is assumed to be good. However, Q itself is not uniform in actual use. Therefore, in the present disclosure, to obtain good coil sensitivity maps by the formula (1) and to further obtain a good magnetic resonance image, uniformity correction is firstly performed for Q so that the Q involved in the calculation of the formula (1) has better uniformity.

Figure 1:
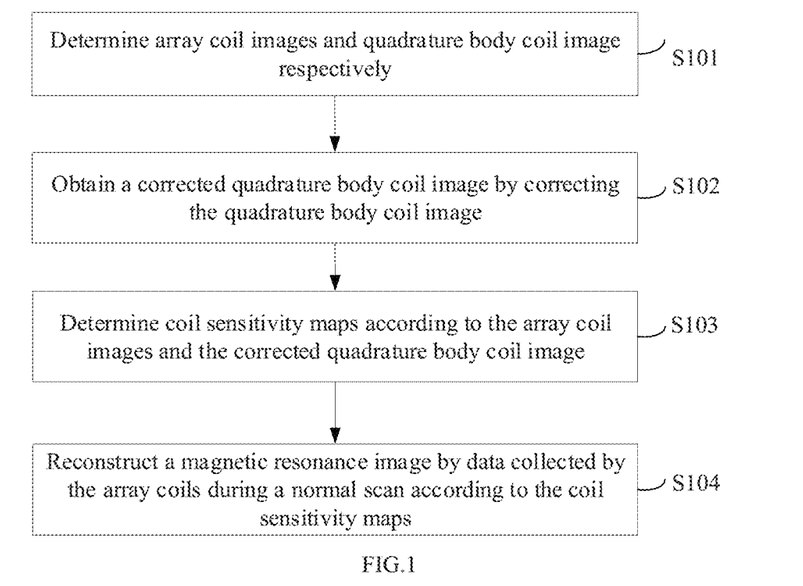
FIG. 1 is a flowchart illustrating a process of a method of reconstructing a magnetic resonance image according to an example of the present disclosure.

FIG. 1 is a flowchart illustrating a process of a method of reconstructing a magnetic resonance image according to an example of the present disclosure. The process can include the following steps.

At step S101, array coil images and a quadrature body coil image are determined respectively.

The array coil images are determined according to first data collected by array coils of an MRI device. Each coil of the array coils corresponds to a respective one of channels. It may be understood that determining array coil images are a mature technology. For example, the first data may be collected by presuming, and then the array coil images are obtained by calculation, which will not be described herein.

The quadrature body coil image is determined according to second data collected by a QBC of the MRI device, or determined by the first data collected by the array coils, or determined by the combination of the first data and the second data. Specific determination methods will be described later.

Figure 8A:
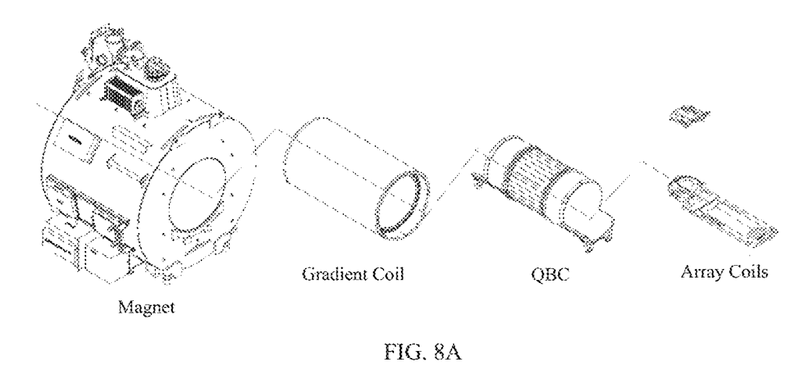
FIGS. 8A and 8B illustrate a quadrature body coil and array coils in an MRI device.
Figure 8B:
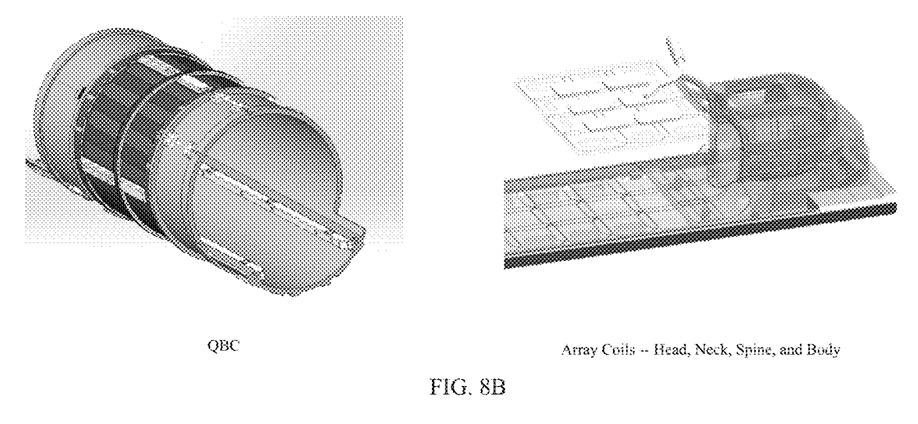

FIG. 8A illustrates the locations of QBC and array coils in an MRI device. FIG. 8B illustrates details of the QBC and the array coils.

At step S102, a corrected quadrature body coil image is obtained by correcting the quadrature body coil image.

At step S103, coil sensitivity maps are determined according to the array coil images and the corrected quadrature body coil image.

At step S104, a magnetic resonance image is reconstructed with third data collected by the array coils during a normal scan according to the coil sensitivity maps. Calculating the magnetic resonance image by using the coil sensitivity maps can be performed by an existing technology. For example, the reconstruction of the magnetic resonance image may be completed by a SENSE method, which will not be described herein.

It should be noted that resolutions of the array coil images and the quadrature body coil image are not limited in methods provided by the present disclosure. That is, in step S101, high-resolution images may be determined, or low-resolution images may be determined. If the images are low-resolution images, at step 104, the obtained coil sensitivity maps may be further processed by using the existing technology to obtain coil sensitivity maps with full FOV, which will not be described herein. It is easily understood that the use of low-resolution images will significantly reduce the calculation quantities of steps S101 to S103.

It should be noted that the array coils have multiple coils, that is, multiple acquisition channels. One channel of the array coils corresponds to one coil sensitivity map, and each channel in the array coils needs to obtain a corresponding coil sensitivity map.

The quadrature body coil image may be corrected by using a method provided by an example of the present disclosure. The corrected quadrature body coil image has better uniformity, and the corrected quadrature body coil image is involved in the calculation of the coil sensitivity maps. The uniformities of the coil sensitivity maps can be better, which can ultimately improve the uniformity of a magnetic resonance image.

Different methods of correcting a quadrature body coil image are provided by the examples of the present disclosure. The quadrature body coil image may be determined by the first data or determined by the second data, or determined by the combination of the first data and the second data. The methods of determining the quadrature body coil image may be divided into three types, which will be introduced one-by-one below. The second data are used for the first method; the combination of the first data and the second data is used for the second method; and the first data are used for the third method.

Figure 2:
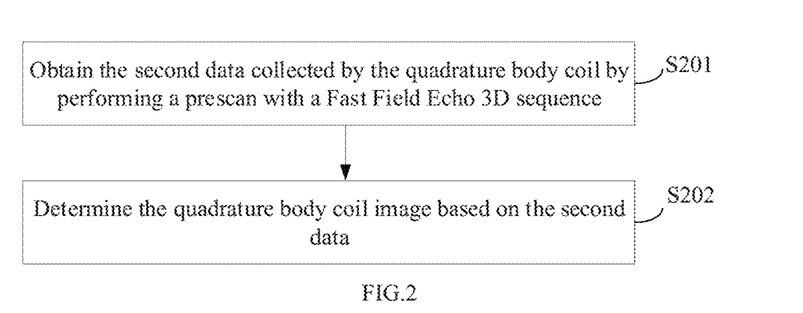
FIG. 2 is a flowchart illustrating a process of a method of determining a quadrature body coil image according to an example of the present disclosure.

FIG. 2 is a flowchart illustrating a process of a method of determining a quadrature body coil image according to an example of the present disclosure. The method can be used as the first method. The process can specifically include the following steps.

At step S201, second data collected by a QBC is obtained by performing a prescan with a Fast Field Echo 3D (FFE3D) sequence.

At step S202, the quadrature body coil image is determined based on the second data collected by the quadrature body coil.

When the prescan is performed, the second data may be collected by using the QBC at the same time, and then, a corresponding quadrature body coil image is obtained by calculation. Meanwhile, when the prescan is performed, the array coil images may be obtained by using the same method. It is known from characteristics of an MRI system that both of the quadrature body coil image and the array coil images are complex images, including a magnitude image and a phase image.

Figure 3:
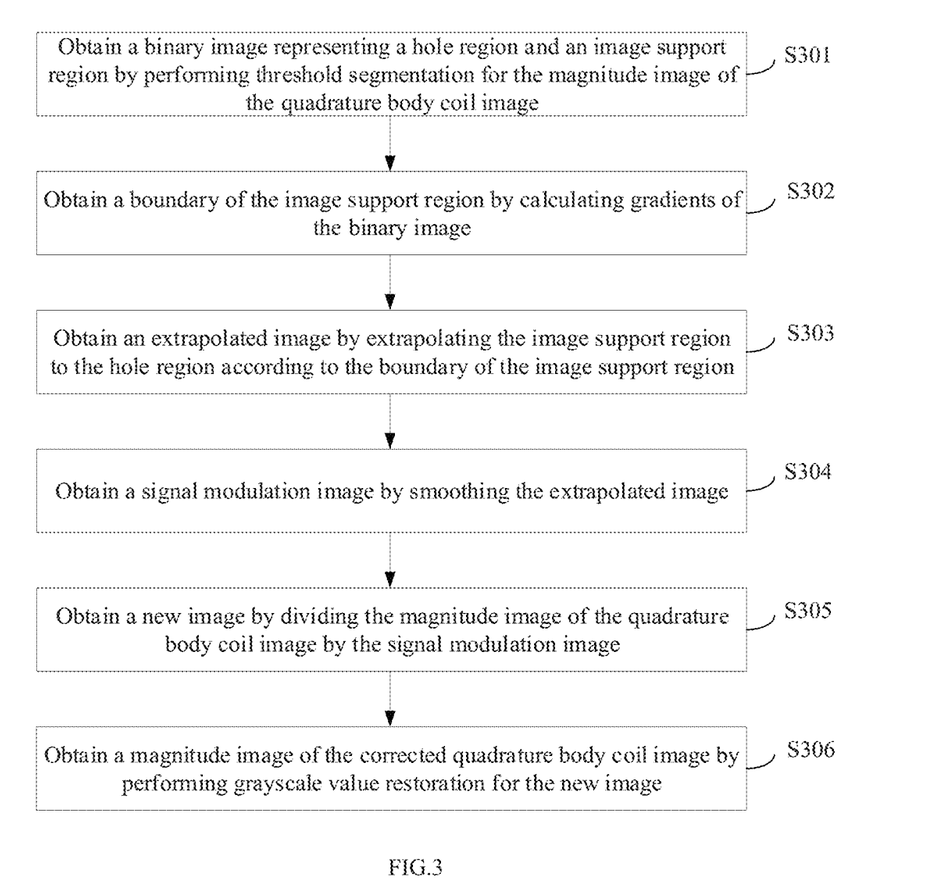
FIG. 3 is a flowchart illustrating a process of a method of correcting a quadrature body coil according to an example of the present disclosure.

A method of correcting the quadrature body coil image obtained by the prescan is introduced below, as shown in FIG. 3. A process of the method can include the following steps.

At step S301, a binary image representing a hole region and an image support region is obtained by performing threshold segmentation for a magnitude image I of the quadrature body coil image.

A threshold may be set by using Otsu's method for image threshold automatic segmentation on histogram. The threshold is applied to the magnitude image I to separate the hole region from the image support region.

It may be understood that a magnitude image generally includes a background and a tissue structure image. The hole region consists of the background and those pixels having very low signals and are therefore of little diagnostic value. The image support region is the region with hole excluded. For example, when a lung region is scanned, the lung region is an image support region, and a region outside the lung region is a hole region.

At step S302, a boundary of the image support region is obtained by calculating gradients of the binary image obtained in step S301.

The boundary of the image support region is obtained at step S302. It should be noted that the boundary of the image support region is a boundary line between the image support region and the hole region.

At step S303, an extrapolated image is obtained by extrapolating the image support region to the hole region according to the boundary of the image support region.

Due to strong variation of signals near the boundary of the image support region, a problem of an edge artifact may be caused in image reconstruction. At step S303, pixels of the image support region are filled into the hole region to reduce signals' variation intensity near the boundary.

A specific extrapolating method may be a mirror reflection method. An extrapolated image includes two parts, the image in the image support region is unchanged, and each pixel in the hole region is changed into a specific pixel of the image support region determined by the mirror reflection method.

At step S304, a signal modulation image N is obtained by smoothing the extrapolated image.

The extrapolated image may not be smooth. Smoothing processing may be performed for the extrapolated image obtained at step S303 to generate a smoothed image. The smoothed image is the signal modulation image N.

At step S305, a new image is obtained by dividing the magnitude image of the quadrature body coil image by the signal modulation image.

At step S305, the magnitude image I of the quadrature body coil image used at step S301 is divided by the signal modulation image N obtained at step S304, i.e., $$\frac{I}{N}.$$

At step S306, a magnitude image of the corrected quadrature body coil image is obtained by performing grayscale value restoration for the new image.

Since the new image obtained at step S305 may have a deviation in the grayscale value, for example, the new image is brighter or darker, it is required to adjust the grayscale value of the new image to obtain a final corrected quadrature body coil image.

Specifically, a reference may be made to the following formula (2), which may represent a method of correcting a magnitude image of a quadrature body coil image provided by this example:

$$\tilde{I} = \frac{I}{N} \times \left\| \frac{N}{I} \right\|_2 \times \|I\|_2, \quad (2)$$

where $\tilde{I}$ refers to a magnitude image of the corrected quadrature body coil image, $$\left\| \frac{N}{I} \right\|_2$$

and $\|I\|_2$ refer to that an adjustment is made to a grayscale value based on a norm. The purpose of $$\left\| \frac{N}{I} \right\|_2 \times \|I\|_2$$

is to correct the intensity so that the average pixel intensity in an image domain is retained $\|\ \|_2$ refers to an L2 norm, i.e., a square root of sum of squares of each point value in a matrix.

In the first method, the coil sensitivity maps may be determined as follows: a coil sensitivity map for each of the channels is obtained by dividing the magnitude image of the array coil images corresponding to the channel by the magnitude image of the corrected quadrature body coil image. The formula (3) may be used to generate the coil sensitivity maps:

$$S_i = \frac{f_i}{\tilde{I}}, \quad (3)$$

where $\tilde{I}$ refers to the magnitude image of the corrected quadrature body coil image, $f_i$ refers to a magnitude image of an array coil image of a channel i, $S_i$ refers to a coil sensitivity map of the channel i, and i refers to a channel index of the array coils.

In the first method of correcting the quadrature body coil image provided above, only one prescan is needed for a same region of a same patient. Uniformity correction is performed for the quadrature body coil image obtained by prescanning, and then, the coil sensitivity maps are calculated by directly using the corrected quadrature body coil image, thereby effectively improving an accuracy of a magnetic resonance image.

Figure 4:
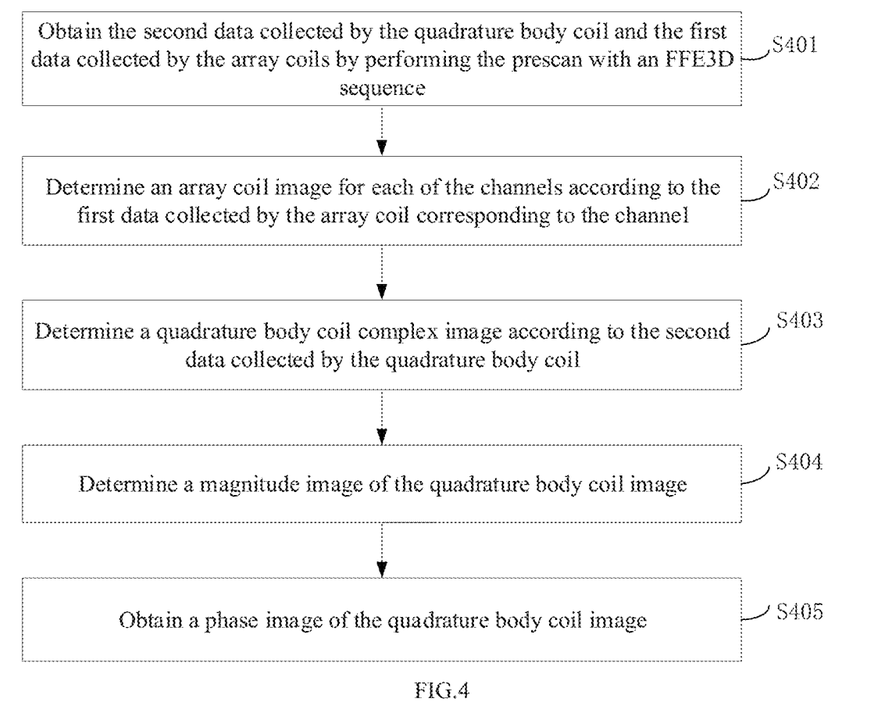
FIG. 4 is a flowchart illustrating a process of a method of determining a quadrature body coil image according to another example of the present disclosure.

FIG. 4 is a flowchart illustrating a process of a method of determining a quadrature body coil image according to another example of the present disclosure. The method can be used as the second method. The process may specifically include the following steps.

At step S401, second data collected by a QBC and first data collected by array coils are obtained by performing a prescan with a FFE3D sequence.

At step S402, an array coil image for each of the channels is determined according to the first data collected by the array coil corresponding to the channel. The array coil image includes a first magnitude image and a first phase image.

At step S403, a quadrature body coil complex image is determined according to the second data collected by the QBC. The quadrature body coil complex image includes a second magnitude image and a second phase image.

At step S404, a magnitude image of the quadrature body coil image is determined according to a Square Root of Sum of Squares (SRSS) of the first magnitude images of the array coil images for all of the channels.

At step S405, a phase image of the quadrature body coil image is obtained according to the second phase image.

Thus, the quadrature body coil image includes a magnitude image and a phase image, where the magnitude image is an SRSS of the first magnitude images, which is indicated by SOS, and the phase image is the second phase image obtained at step S403, which is indicated by $\varphi$.

The SRSS of the first magnitude images may be obtained by the following formula (4):

$$SOS = \sqrt{\sum_{i=1}^{N_c} M_i^2}, \quad (4)$$

where $M_i$ refers to a first magnitude image corresponding to a channel i determined at step S402, and $N_c$ refers to the number of channels. SOS refers to a magnitude image of the quadrature body coil image. As can be seen from the formula (4), SOS is obtained from the first magnitude images for all of the channels. It should be noted that $M_i$ does not include phase information of the array coils.

The quadrature body coil image may be obtained by the following formula (5).

$$Q_{com} = SOS * \exp(-i\varphi) \quad (5)$$

where $Q_{com}$ refers to the quadrature body coil image, and $\varphi$ refers to the second phase image of the quadrature body coil complex image obtained by prescanning.

Since the first data obtained in the array coils is used to generate the quadrature body coil image in this example, it may be seen from the formula (5) that the SOS is the magnitude image of the quadrature body coil image. Therefore, the correction of the magnitude image of the quadrature body coil image becomes the correction of the SOS. The steps for correcting the quadrature body coil image may be similar to the steps illustrated in FIG. 3.

A binary image representing a hole region and an image support region is obtained by performing threshold segmentation for the magnitude image SOS of the quadrature body coil image.

A boundary of the image support region is obtained by calculating gradients of the binary image.

An extrapolated image is obtained by extrapolating the image support region to the hole region according to the boundary of the image support region.

A signal modulation image N is obtained by smoothing the extrapolated image.

A new image is obtained by dividing the magnitude image SOS of the quadrature body coil image by the signal modulation image N.

A magnitude image of the corrected quadrature body coil image is obtained by performing grayscale value restoration for the new image.

The formula (6) for correcting the magnitude image of the quadrature body coil image in this example is as follows:

$$SOS = \frac{SOS}{N} \times \left\| \frac{N}{SOS} \right\|_2 \times \|SOS\|_2, \quad (6)$$

where SOS refers to a result of performing uniformity correction for the magnitude image of the quadrature body coil image, and the SOS refers to the magnitude image of the quadrature body coil image determined based on the first magnitude images of all channels.

In the second method, the coil sensitivity maps may be determined as follows: a coil sensitivity map for each of the channels is obtained by dividing the array coil image corresponding to the channel by the corrected quadrature body coil image. Specifically, the following formula (7) may be used:

$$S_i = \frac{C_i}{SOS * \exp(-i\varphi)}, \quad (7)$$

where $S_i$ refers to a coil sensitivity map for a channel i, $C_i$ refers to an array coil image corresponding to the channel i obtained at step S402, and $C_i$ refers to a complex image, and φ refers to the second phase image of the quadrature body coil image obtained by prescanning. When a prescan is performed, the array coil images of all channels may be obtained. It may be understood that the first magnitude image of the complex image $C_i$ is $M_i$.

Coil sensitivity maps of all of the channels may be calculated based on the formula (7) in this example.

The second method of correcting the quadrature body coil image provided above is same as the first method, and it only needs to perform one prescan for a same region of a same patient. Further, the accuracy of a magnetic resonance image may be effectively improved by performing calculations for the coil sensitivity maps with the corrected quadrature body coil image. The reason why this method adopts the SOS is that the SOS has a relatively high signal-to-noise ratio. Uniformity correction may have a better result and more accurate coil sensitivity maps are obtained. Further, the coil sensitivity maps obtained by using this correcting method retain phase information, thereby increasing the accuracy.

It is easily understood that in the above two examples, since both of the array coil images and the quadrature body coil image are complex images, when coil sensitivity maps are finally calculated, more accurate coil sensitivity maps may be obtained by introducing the phase information, or calculation may be simplified without introducing the phase information. Whether or not to use the phase information in a particular method is not limited in the present disclosure.

The third method differs from the first method and the second method. The second data is used in the first method and the second method. However, in the third method, a quadrature body coil image is determined by using the first data of the array coils only.

Figure 5:
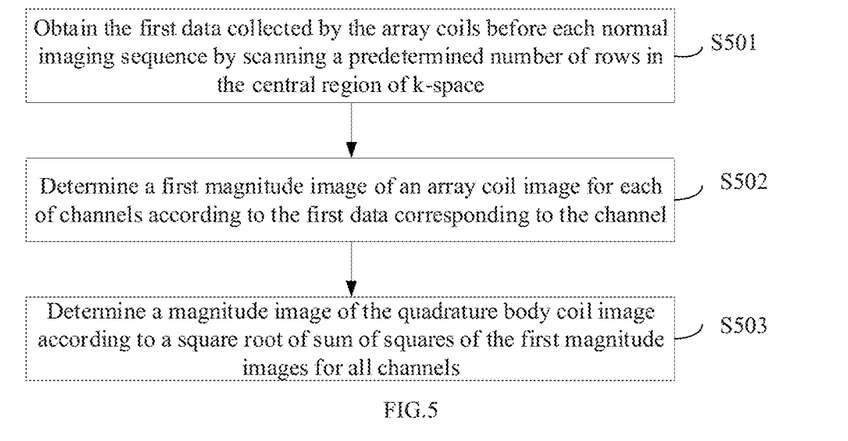
FIG. 5 is a flowchart illustrating a process of a method of determining a quadrature body coil image according to still another example of the present disclosure.

FIG. 5 is a flowchart illustrating a process of a method of determining a quadrature body coil image according to still another example of the present disclosure. The method can be used as the third method. The process may specifically include the following steps.

At step S501, first data collected by the array coils before each normal imaging sequence is obtained by scanning a predetermined number of rows near a central region of k-space.

The k-space refers to a magnetic resonance signal space (a raw data space) that reflects characteristics of magnetic resonance signals in a frequency domain. Raw signal data obtained by magnetic resonance scanning is stored in the k-space, and a magnetic resonance image may be obtained by transforming (e.g., by Fourier transform) the data in the k-space. A principle of MRI spatial encoding specifies that each row of the k-space has a dedicated phase encoding. If the rows near the central region of the k-space are determined, the corresponding phase encoding lines can be determined. Then corresponding magnetic resonance scanning parameters can be set to achieve collection of magnetic resonance data corresponding to a central region of the k-space.

The scanning of the predetermined number of rows is for quickly obtaining an array coil image of each channel. The scan may be called prescan. In this example, for one patient the prescan may not be just one scan, it may indicate a series of scan operations. Generally, the predetermined number of rows takes an integer power of 2, for example, the predetermined number of rows may be 32, or 64. It may be understood that, when 32 rows of data are taken, time for image reconstruction is relatively shorter than that for 64 rows of data. Specifically, at step 501, 32 rows or 64 rows near the central region of k-space are scanned separately before each normal imaging sequence. The reason for collecting data near the central region of k-space is that the data mainly reflect contrast information.

At step S502, a first magnitude image of an array coil image for each of the channels is determined according to the first data corresponding to the channel.

At step S503, a magnitude image of the quadrature body coil image is determined according to an SRSS of the first magnitude images for all of the channels. The magnitude image of the quadrature body coil image may be represented by an SOS.

Similarly, the SOS may be calculated by the formula (4).

In this method, the quadrature body coil image is constructed by using the first data collected by the array coils only. The SOS obtained at step S503 is the magnitude image of the quadrature body coil image.

Apparently, correcting the magnitude image of the quadrature body coil image means correcting the SOS. The specific method has the same steps as those in the second method, which will not be described in detail herein.

Compared with the second method, the prescan of this method is done just before normal imaging sequence, so potential motion problems may be reduced.

In the third method, coil sensitivity maps may be determined as follows: a coil sensitivity map for each of the channels is obtained by dividing the magnitude image of the array coil image corresponding to the channel by the magnitude image of the corrected quadrature body coil image.

Specifically, the coil sensitivity maps may be calculated by the following formula (8):

$$S_i = \frac{M_i}{SOS}, \quad (8)$$

where $M_i$ is a first magnitude image corresponding to channel i determined at step S502, and SOS is a result of correcting uniformity of the SOS. $M_i$ is merely the magnitude image of the array coil image, which does not include phase information.

According to the methods provided by the above examples, a problem of image non-uniformity caused by different factors, such as uniformity issues of a radio frequency transmitting field or a main magnetic field may be solved. By involving the corrected quadrature body coil image in the calculation of the coil sensitivity maps, the coil sensitivity maps may be made more accurate and reused for the same tissue structure of the same patient.

Figure 6A:
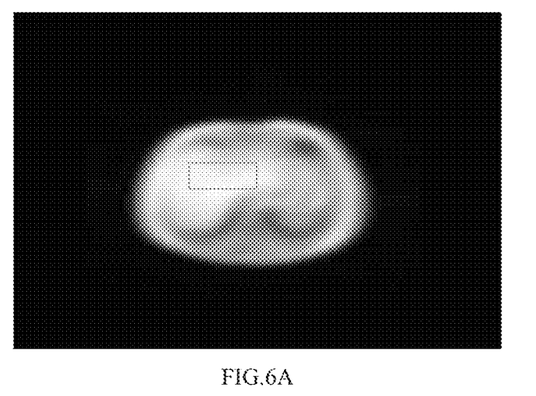
FIG. 6A is a quadrature body coil image before uniformity correction.
Figure 6B:
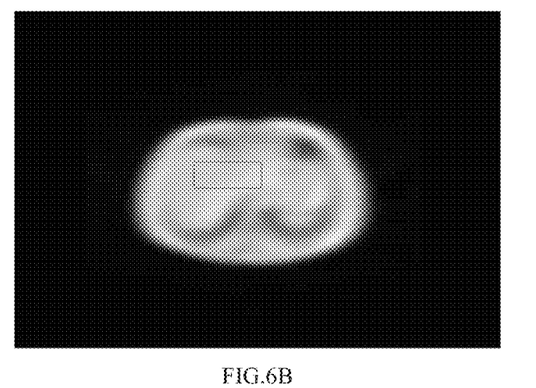
FIG. 6B is a quadrature body coil image after uniformity correction.
Figure 6C:
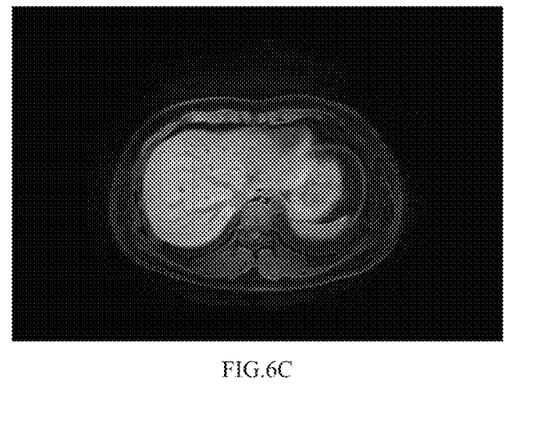
FIG. 6C is a magnetic resonance image corresponding to FIG. 6A.
Figure 6D:
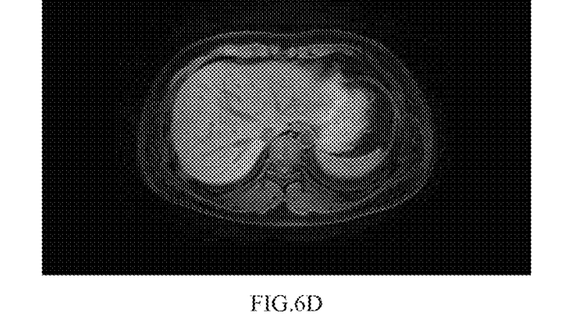
FIG. 6D is a magnetic resonance image corresponding to FIG. 6B.

Beneficial effects provided by the first method of the present disclosure will be illustrated by using specific images below. FIG. 6A is a quadrature body coil image before correction. FIG. 6B is a corrected quadrature body coil image provided by the first method of the present disclosure. FIG. 6C is a magnetic resonance image corresponding to FIG. 6A. FIG. 6D is a magnetic resonance image corresponding to FIG. 6B.

It can be seen from subjective vision that, a liver region of FIG. 6A and FIG. 6C is bright and the uniformity is not good. After uniformity correction, a gray scale of the liver region is reduced, and the image of the liver region of FIG. 6D is more uniform than that of FIG. 6C.

The uniformities of images are measured by comparing standard deviations (stdev) of pixels in a box region in FIG. 6A to FIG. 6D, and the smaller stdev brings better uniformity.

First, a correcting effect of the quadrature body coil images is calculated. As shown in Table 1, the stdev of FIG. 6A is 140.6, and the stdev of FIG. 6B is 82.3. Therefore, it may be proved that the uniformity of the corrected quadrature body coil image is improved. Next, magnetic resonance images are compared. As shown in Table 2, the stdev of FIG. 6C is 202.8, and the stdev of FIG. 6D is 158.8. That is, the uniformity of the magnetic resonance image is improved due to the improvement of the uniformity of the quadrature body coil image. Further, the signal-to-noise ratio (snr) is also increased after correction.

TABLE 1

Comparison of standard deviations and signal-to-noise ratios of quadrature body coil images

|  | FIG. 6A | FIG. 6B |
|---|---|---|
| stdev | 140.6 | 82.3 |
| snr | 26.3 | 39.3 |

TABLE 2

Comparison of standard deviations and signal-to-noise ratios of magnetic resonance images

|  | FIG. 6C | FIG. 6D |
|---|---|---|
| stdev | 202.8 | 158.8 |
| snr | 11.9 | 12.9 |

Based on methods of reconstructing a magnetic resonance image provided by the above examples, a device for reconstructing a magnetic resonance image is also provided by an example of the present disclosure, which will be described below in detail in conjunction with accompanying drawings.

Figure 7A:
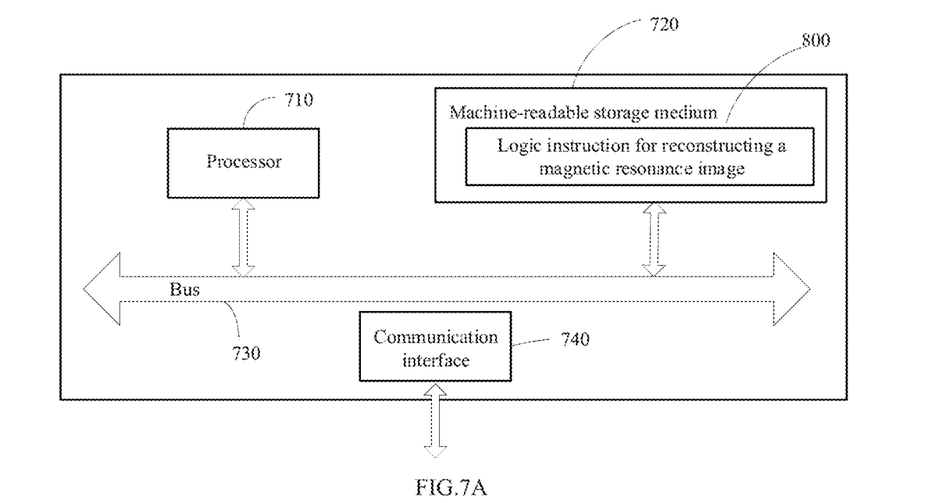
FIG. 7A is a schematic diagram illustrating a hardware structure of a device for reconstructing a magnetic resonance image according to an example of the present disclosure.

FIG. 7A is a schematic diagram illustrating a hardware structure of a device for reconstructing a magnetic resonance image according to an example of the present disclosure. The device may include a processor 710 and a machine readable storage medium 720, where the processor 710 and the machine readable storage medium 720 are usually connected with each other via an internal bus 730. In other possible implementations, the device may also include an external interface 740 to communicate with other devices or components.

In different examples, the machine readable storage medium 720 may be a Random Access Memory (RAM), a volatile memory, a non-volatile memory, a flash memory, a storage drive (e.g., hard disk drive), a solid state hard disk, any type of storage disk compact disk, Digital Video Disk (DVD)), or a similar storage medium, or a combination thereof.

Figure 7B:
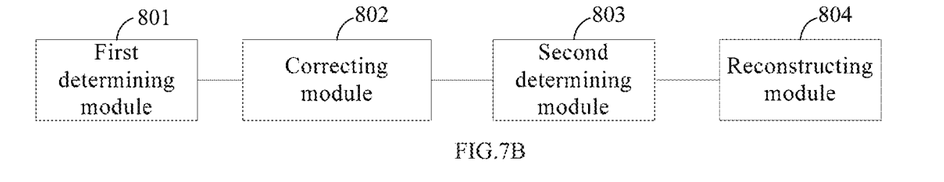
FIG. 7B is a schematic diagram illustrating a functional module of control logic for reconstructing a magnetic resonance image according to an example of the present disclosure.

Further, the machine readable storage medium 720 stores control logic 800 for reconstructing a magnetic resonance image. As shown in FIG. 7B, functionally, the control logic includes:

A first determining module 801, a uniformity correcting module 802, a second determining module 803 and a reconstructing module 804.

The first determining module 801 is configured to determine array coil images and a quadrature body coil image respectively.

The correcting module 802 is configured to obtain a corrected quadrature body coil image by correcting a magnitude image of the quadrature body coil image.

The second determining module 803 is configured to determine coil sensitivity maps according to the array coil images and the corrected quadrature body coil image.

The reconstructing module 804 is configured to obtain a magnetic resonance image by reconstructing data collected by the array coils during a normal scan according to the coil sensitivity maps.

The quadrature body coil image may be corrected by a device provided by an example of the present disclosure. The corrected quadrature body coil image has better uniformity, and the corrected quadrature body coil image is involved in the calculation of the coil sensitivity maps. The uniformities of the coil sensitivity maps are better, which ultimately improve the quality of a magnetic resonance image.

A software implementation is taken as an example below to further describe how a device for reconstructing a magnetic resonance image executes the control logic 800. In this example, the control logic 800 of the present disclosure should be understood as computer instructions stored in the machine readable storage medium 720. When a CPU 710 on the MRI device of the present disclosure executes the control logic 800, the CPU 710 may perform the following operations by invoking the instructions corresponding to the control logic 800 stored on the machine readable storage medium 720.

Array coil images are determined according to first data collected by array coils of an MRI device during a prescan.

A quadrature body coil image is determined according to at least one of second data collected by a QBC of the MRI device during the prescan and the first data collected by the array coils.

A corrected quadrature body coil image is obtained by correcting the quadrature body coil image.

Coil sensitivity maps are determined according to the array coil images and the corrected quadrature body coil image.

A magnetic resonance image is reconstructed with third data collected by the array coils during a normal scan according to the coil sensitivity maps.

The device of the present disclosure may correct uniformity of a quadrature body coil image in many manners. The quadrature body coil image may be determined by the second data, or determined by the first data, or determined by the combination of the first data and the second data. The implementations of determining the quadrature body coil image may be divided into three types, will introduce them one-by-one.

The First Implementation:

When the processor determines a quadrature body coil image by reading machine-readable instructions corresponding to the control logic in a storage medium, the followings may be specifically included.

Second data collected by a QBC is obtained by performing a prescan with a Fast Field Echo 3D (FFE3D) sequence.

The quadrature body coil image is determined based on the second data collected by the quadrature body coil.

Further, when the processor may perform for the quadrature body coil image by reading machine readable instructions corresponding to the control logic in a storage medium, the followings may be specifically included.

A binary image representing a hole region and an image support region is obtained by performing threshold segmentation for a magnitude image I of the quadrature body coil image.

A boundary of the image support region is obtained by calculating gradients of the binary image.

An extrapolated image is obtained by extrapolating the image support region to the hole region according to the boundary of the image support region.

A signal modulation image is obtained by smoothing the extrapolated image.

A new image is obtained by dividing the magnitude image of the quadrature body coil image by the signal modulation image.

A magnitude image of the corrected quadrature body coil image is obtained by performing grayscale value restoration for the new image.

Further, when the processor determines coil sensitivity maps by reading machine-readable instructions corresponding to the control logic in a storage medium, the followings may be specifically included.

A coil sensitivity map for each of the channels is obtained by dividing the magnitude image of the array coil image corresponding to the channel by the magnitude image of the corrected quadrature body coil image.

The Second Implementation:

When the processor determines a quadrature body coil image by reading machine-readable instructions corresponding to the control logic in a storage medium, the followings may be specifically included.

Second data collected by a QBC and first data collected by array coils are obtained by performing a prescan with a FFE3D sequence.

An array coil image for each of the channels is determined according to the first data collected by the array coil corresponding to the channel, where the array coil image comprises a first magnitude image and a first phase image.

A quadrature body coil complex image is determined according to the second data collected by the QBC, where the quadrature body coil complex image includes a second magnitude image and a second phase image.

A magnitude image of the quadrature body coil image is determined according to a Square Root of Sum of Squares (SRSS) of the first magnitude images for all channels.

A phase image of the quadrature body coil image is obtained according to the second phase image.

Further, when the processor determines coil sensitivity maps by reading machine readable instructions corresponding to the control logic in a storage medium, the following may be specifically included.

A coil sensitivity map for each of the channels is obtained by dividing the array coil image corresponding to the channel by the corrected quadrature body coil image.

The specific blocks of correcting of the quadrature body coil image may be referred to the blocks of the first implementation, which will not be described herein.

The Third Implementation:

When the processor determines a quadrature body coil image by reading machine-readable instructions corresponding to the control logic in a storage medium, the followings may be specifically included.

First data collected by the array coils before each normal imaging sequence is obtained by scanning a predetermined number of rows near the central region of k-space.

A first magnitude image of an array coil image for each of channels is determined according to the first data corresponding to the channel.

A magnitude image of the quadrature body coil image is determined according to a SRSS of the first magnitude images for all channels. The magnitude image of the quadrature body coil image may be represented by a SOS.

Further, when the processor determines coil sensitivity maps by reading machine readable instructions corresponding to the control logic in a storage medium, the following may be specifically included.

A coil sensitivity map for each of the channels is obtained by dividing the magnitude image of the array coil image corresponding to the channel by the magnitude image of the corrected quadrature body coil image.

The specific blocks of correcting of the quadrature body coil image may be referred to the blocks of the first implementation, which will not be described herein.

The device provided by the above example may solve a problem of image non-uniformity caused by different factors, such as uniformity issues of a radio frequency transmitting field or a main magnetic field. By involving the corrected quadrature body boil image in the calculation of the coil sensitivity maps, the coil sensitivity maps may be made more accurate and reused for the same tissue structure of the same patient.

Further, an example of the present disclosure also provides a computer readable storage medium that stores instructions. When the instructions are executed by one or more processors, the one or more processors are caused to perform a method of reconstructing a magnetic resonance image:

Array coil images are determined according to first data collected by array coils of a MRI device during a prescan.

A quadrature body coil image is determined according to at least one of second data collected by a QBC of the MRI device during the prescan and the first data collected by the array coils.

A corrected quadrature body coil image is obtained by correcting the quadrature body coil image.

Coil sensitivity maps are determined according to the array coil images and the corrected quadrature body coil image.

A magnetic resonance image is reconstructed with third data collected by the array coils during a normal scan according to the coil sensitivity maps.

Further, the theme and functional operations described in the above examples may be implemented by using a digital electronic circuit, a tangibly-embodied computer software or firmware, a computer hardware including a structure of the present disclosure and an equivalent structure, or one or more combinations thereof. Examples of the theme described in the present disclosure may be implemented as one or more computer programs, namely, as one or more modules in computer program instructions encoded on a tangible non-transitory program carrier to be executed by a data processing device or to control operations of a data processing device. Alternatively or additionally, the program instructions may be encoded on an artificially generated transmission signal, such as electric, optical and electromagnetic signals generated by a machine and the signal is generated to encode and transmit information to an appropriate receiver device for execution by a data processing device. The computer storage medium may be a machine readable storage device, a machine readable storage substrate, a random or serial access memory device, or one or more combinations thereof.

Processing and logical flows described in the present disclosure may be executed by one or more programmable computers for executing one or more computer programs, to perform corresponding functions by operating based on input data and generating an output. The processing and logical flows may also be executed by a dedicated logical circuit, such as a Field Programmable Gate Array (FPGA) or an Application Specific Integrated Circuit (ASIC), and the device may also be implemented as a dedicated logical circuit.

Computers applicable to executing computer programs include, for example, a universal and/or dedicated microprocessor, or any other type of central processing unit. Usually, the central processing unit will receive instructions and data from a read-only memory and/or a random access memory. Basic components of the computer include a central processing unit for implementing or executing instructions and one or more memory devices storing instructions and data. Usually, the computer may also include one or more mass storage devices for storing data, such as a magnetic disk, a magneto-optical disk or an optical disk, or the computer will be operably coupled to the mass storage device to receive data from the mass storage device or transmit data to the mass storage device, or to do both. However, the computer may not necessarily have such device. Further, the computer may be embedded in another device, such as a mobile phone, a Personal Digital Assistant (PDA), a mobile audio or video player, a Global Positioning System (GPS) receiver, or a portable storage device such as a Universal Serial Bus (USB) flash drive, which are only illustrated as examples.

Computer readable mediums applicable to storing computer program instructions and data include all forms of non-volatile memories, media and memory devices, such as a semiconductor memory device (e.g., an Erasable Programmable Read-Only Memory (EPROM), an Electrically Erasable Programmable Read-Only Memory (EEPROM), and a flash memory device), a magnetic disk (e.g., an internal hard disk or a mobile disk), a magneto-optical disk and CD-ROM and DVD-ROM disks. The processor and the memory may be supplemented by or incorporated in a dedicated logical circuit.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of reconstructing a magnetic resonance image, comprising:
   determining array coil images by reconstructing first data collected by a plurality of array coils of a Magnetic Resonance Imaging (MRI) device during a prescan, wherein each coil of the plurality of array coils corresponds to a respective channel of a plurality of channels;
   determining a quadrature body coil image by calculating at least one of second data collected by a quadrature body coil of the MRI device during the prescan or the first data collected by the array coils;
   obtaining a corrected quadrature body coil image by correcting a uniformity of the quadrature body coil image, wherein non-uniformity of the quadrature body coil image is caused by at least one of a main magnetic field, a radio frequency transmitting field, or a radio frequency receiving field of the MRI device;
   determining coil sensitivity maps according to the array coil images and the corrected quadrature body coil image; and reconstructing a magnetic resonance image with third data collected by the array coils during a normal scan according to the coil sensitivity maps, wherein correcting the uniformity of the quadrature body coil image comprises:

correcting a magnitude image of the quadrature body coil image by obtaining a binary image representing a hole region and an image support region by performing threshold segmentation for the magnitude image of the quadrature body coil image, calculating gradients of the binary image to obtain a boundary of the image support region, extrapolating the image support region to the hole region according to the boundary of the image support region to obtain an extrapolated image, smoothing the extrapolated image to obtain a signal modulation image, dividing the magnitude image of the quadrature body coil image by the signal modulation image to generate a new image, and obtaining a magnitude image of the corrected quadrature body coil image by performing grayscale value restoration for the new image.

2. The method of claim 1, wherein determining the quadrature body coil image comprises:

obtaining the second data collected by the quadrature body coil by performing the prescan with a Fast Field Echo 3D (three dimensional) sequence; and determining the quadrature body coil image based on the second data collected by the quadrature body coil.

3. The method of claim 2, wherein determining coil sensitivity maps according to the array coil images and the corrected quadrature body coil image comprises:

for each of the plurality of channels, obtaining a respective coil sensitivity map by dividing a magnitude image of an array coil image corresponding to the channel by a magnitude image of the corrected quadrature body coil image.

4. The method of claim 1, wherein determining the quadrature body coil image comprises:

obtaining the second data collected by the quadrature body coil and the first data collected by the array coils by performing the prescan with a Fast Field Echo 3D sequence;

determining an array coil image for each of the plurality of channels according to the first data collected by the array coil corresponding to the channel, wherein the array coil image comprises a first magnitude image and a first phase image;

determining a quadrature body coil complex image according to the second data collected by the quadrature body coil, wherein the quadrature body coil complex image comprises a second magnitude image and a second phase image;

determining the magnitude image of the quadrature body coil image according to a square root of sum of squares of the first magnitude images for the plurality of channels; and obtaining a phase image of the quadrature body coil image according to the second phase image of the quadrature body coil complex image.

5. The method of claim 4, wherein determining coil sensitivity maps according to the array coil images and the corrected quadrature body coil image comprises:

for each of the plurality of channels, obtaining a respective coil sensitivity map by dividing an array coil image corresponding to the channel by the corrected quadrature body coil image, wherein the obtained coil sensitivity map comprises phase information associated with a first phase image of the corresponding array coil image and a phase image of the corrected quadrature body coil image, wherein the phase image of the corrected quadrature body coil image is the obtained phase image of the quadrature body coil image according to the second phase image.

6. The method of claim 1, wherein determining the quadrature body coil image comprises:

obtaining the first data collected by the array coils before each normal imaging sequence by scanning a predetermined number of rows near a central region of k-space;

determining a first magnitude image of an array coil image for each of the plurality of channels according to the first data corresponding to the channel; and determining a magnitude image of the quadrature body coil image according to a square root of sum of squares of the first magnitude images for the plurality of channels.

7. The method of claim 6, wherein determining coil sensitivity maps according to the array coil images and the corrected quadrature body coil image comprises:

for each of the plurality of channels, obtaining a respective coil sensitivity map by dividing a first magnitude image of an array coil image corresponding to the channel by a magnitude image of the corrected quadrature body coil image, wherein the magnitude image of the corrected quadrature body coil image is determined based on the magnitude image of the quadrature body coil image.

8. The method of claim 1, wherein extrapolating the image support region to the hole region comprises:

keeping pixels in the image support region unchanged; and changing each pixel in the hole region into a specific pixel of the image support region determined by mirror reflection.

9. A device for reconstructing a magnetic resonance image, comprising:

at least one processor; and at least one non-transitory machine-readable storage medium coupled to the at least one processor having machine-executable instructions stored thereon that, when executed by the at least one processor, cause the at least one processor to perform operations comprising:

determining array coil images by reconstructing first data collected by array coils of an MM device during a prescan, wherein each coil of the array coils corresponds to a respective channel of channels;

determining a quadrature body coil image by calculating at least one of second data collected by a quadrature body coil of the MRI device during the prescan or the first data collected by the array coils;

obtaining a corrected quadrature body coil image by correcting a uniformity of the quadrature body coil image, wherein non-uniformity of the quadrature body coil image is caused by at least one of a main magnetic field, a radio frequency transmitting field, or a radio frequency receiving field of the MRI device;

determining coil sensitivity maps according to the array coil images and the corrected quadrature body coil image; and reconstructing a magnetic resonance image with third data collected by the array coils during a normal scan according to the coil sensitivity maps, wherein correcting the uniformity of the quadrature body coil image comprises correcting a magnitude image of the quadrature body coil image by obtaining a binary image representing a hole region and an image support region by performing threshold segmentation for the magnitude image of the quadrature body coil image, calculating gradients of the binary image to obtain a boundary of the image support region, extrapolating the image support region to the hole region according to the boundary of the image support region to obtain an extrapolated image, smoothing the extrapolated image to obtain a signal modulation image, dividing the magnitude image of the quadrature body coil image by the signal modulation image to generate a new image, and obtaining a magnitude image of the corrected quadrature body coil image by performing gray-scale value restoration for the new image.

10. The device of claim 9, wherein determining the quadrature body coil image comprises:

obtaining the second data collected by the quadrature body coil by performing the prescan with a Fast Field Echo 3D sequence; and determining the quadrature body coil image based on the second data collected by the quadrature body coil.

11. The device of claim 9, wherein determining the quadrature body coil image comprises:

obtaining the second data collected by the quadrature body coil and the first data collected by the array coils by performing the prescan with a Fast Field Echo 3D sequence;

determining an array coil image for each of the channels according to the first data collected by the array coil corresponding to the channel, wherein the array coil image comprises a first magnitude image and a first phase image;

determining a quadrature body coil complex image according to the second data collected by the quadrature body coil, wherein the quadrature body coil complex image comprises a second magnitude image and a second phase image;

determining a magnitude image of the quadrature body coil image according to a square root of sum of squares of the first magnitude images for the channels; and obtaining a phase image of the quadrature body coil image according to the second phase image of the quadrature body coil complex image.

12. The device of claim 9, wherein determining the quadrature body coil image comprises:

obtaining the first data collected by the array coils before each normal imaging sequence by scanning a predetermined number of rows near the central region of k-space;

determining a first magnitude image of an array coil image for each of channels according to the first data corresponding to the channel; and determining a magnitude image of the quadrature body coil image according to a square root of sum of squares of the first magnitude images for the channels.

13. The device of claim 9, wherein extrapolating the image support region to the hole region comprises:

keeping pixels in the image support region unchanged; and changing each pixel in the hole region into a specific pixel of the image support region determined by mirror reflection.

14. The device of claim 9, wherein determining the coil sensitivity maps comprises:

for each of the channels, obtaining a respective coil sensitivity map by dividing a magnitude image of an array coil image corresponding to the channel by a magnitude image of the corrected quadrature body coil image.

15. The device of claim 9, wherein determining the coil sensitivity maps comprises:

for each of the channels, obtaining a respective coil sensitivity map by dividing an array coil image corresponding to the channel by the corrected quadrature body coil image.

16. A non-transitory machine-readable storage medium coupled to at least one processor having machine-executable instructions stored thereon that, when executed by the at least one processor, cause the at least one processor to perform operations comprising:

determining array coil images by reconstructing first data collected by array coils of an MRI device during a prescan, wherein each coil of the array coils corresponds to a respective channel of channels;

determining a quadrature body coil image by calculating at least one of second data collected by a quadrature body coil of the MRI device during the prescan or the first data collected by the array coils;

obtaining a corrected quadrature body coil image by correcting a uniformity of the quadrature body coil image, wherein non-uniformity of the quadrature body coil image is caused by at least one of a main magnetic field, a radio frequency transmitting field, or a radio frequency receiving field of the MRI device;

determining coil sensitivity maps according to the array coil images and the corrected quadrature body coil image; and reconstructing a magnetic resonance image with third data collected by the array coils during a normal scan according to the coil sensitivity maps, wherein correcting the uniformity of the quadrature body coil image comprises:

correcting a magnitude image of the quadrature body coil image by obtaining a binary image representing a hole region and an image support region by performing threshold segmentation for the magnitude image of the quadrature body coil image, calculating gradients of the binary image to obtain a boundary of the image support region, extrapolating the image support region to the hole region according to the boundary of the image support region to obtain an extrapolated image, smoothing the extrapolated image to obtain a signal modulation image, dividing the magnitude image of the quadrature body coil image by the signal modulation image to generate a new image, and obtaining a magnitude image of the corrected quadrature body coil image by performing gray-scale value restoration for the new image.

* * * * *